(12) United States Patent
Hashimoto et al.

(10) Patent No.: US 8,174,913 B2
(45) Date of Patent: May 8, 2012

(54) SEMICONDUCTOR MEMORY DEVICE AND DRIVING METHOD OF THE SAME

(75) Inventors: Daisuke Hashimoto, Yokohama (JP); Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 249 days.

(21) Appl. No.: 12/703,548

(22) Filed: Feb. 10, 2010

(65) Prior Publication Data
US 2011/0063886 A1    Mar. 17, 2011

(30) Foreign Application Priority Data

Sep. 14, 2009  (JP) ................................. 2009-211887

(51) Int. Cl.
- *G11C 7/00* (2006.01)
- *G11C 17/18* (2006.01)
- *G11C 11/22* (2006.01)
- *G11C 11/34* (2006.01)
- *G11C 8/00* (2006.01)

(52) U.S. Cl. ...................... 365/200; 365/201; 365/225.7; 365/145; 365/149; 365/185.09; 365/185.11; 365/230.03

(58) Field of Classification Search .................. 365/200, 365/201, 225.7, 145, 149, 185.09, 185.11, 365/230.03
See application file for complete search history.

(56) References Cited

U.S. PATENT DOCUMENTS

| | | | |
|---|---|---|---|
| 5,243,570 A * | 9/1993 | Saruwatari | ..................... 365/200 |
| 5,477,492 A | 12/1995 | Ohsaki et al. | |
| 5,519,657 A * | 5/1996 | Arimoto | ........................ 365/200 |
| 5,633,826 A * | 5/1997 | Tsukada | ........................ 365/200 |
| 5,642,316 A * | 6/1997 | Tran et al. | ..................... 365/200 |
| 5,708,619 A * | 1/1998 | Gillingham | .................... 365/200 |
| 6,144,577 A * | 11/2000 | Hidaka | ..................... 365/230.03 |
| 6,307,804 B1 * | 10/2001 | Ooishi | ..................... 365/230.03 |
| 6,310,806 B1 * | 10/2001 | Higashi et al. | ................ 365/200 |
| 6,426,906 B1 | 7/2002 | Igarashi | |
| 7,236,413 B2 * | 6/2007 | Nishihara | ..................... 365/200 |

(Continued)

FOREIGN PATENT DOCUMENTS

JP      03-162798      7/1991

(Continued)

OTHER PUBLICATIONS

Background Art Information.

*Primary Examiner* — Trong Phan
(74) *Attorney, Agent, or Firm* — Knobbe, Martens, Olson & Bear LLC

(57) ABSTRACT

A memory includes a cell region; a spare region including a spare block; a fuse region storing remedy information necessary for an access to the spare block instead of a remedy target block, the fuse region comprising non-defective cells in the remedy target block, or including cells in a first block of the spare region; an initial reading fuse storing a block address for identifying the remedy target block or the first block allocated as the fuse region, and a selection address for selecting a region in the remedy target block or a region in the first block allocated as the fuse region; and a controller configured to acquire the remedy information from the fuse region based on the block address and the selection address, and to change the access to the remedy target block to the access to the spare block based on the remedy information.

12 Claims, 5 Drawing Sheets

U.S. PATENT DOCUMENTS

| | | | |
|---|---|---|---|
| 7,342,843 B2 * | 3/2008 | Takeuchi et al. | 365/225.7 |
| 7,688,659 B2 * | 3/2010 | Mori et al. | 365/201 |
| 7,911,872 B2 * | 3/2011 | Lakhani et al. | 365/200 |
| 7,924,639 B2 * | 4/2011 | Park et al. | 365/200 |
| 8,031,544 B2 * | 10/2011 | Kim et al. | 365/200 |
| 2007/0174744 A1 | 7/2007 | Kim | |

FOREIGN PATENT DOCUMENTS

| | | |
|---|---|---|
| JP | 2002-100183 | 4/2002 |

* cited by examiner

US 8,174,913 B2

SEMICONDUCTOR MEMORY DEVICE AND DRIVING METHOD OF THE SAME

CROSS-REFERENCE TO RELATED APPLICATION

This application is based upon and claims the benefit of priority from the prior Japanese Patent Applications No. 2009-211887, filed on Sep. 14, 2009, the entire contents of which are incorporated herein by reference.

BACKGROUND OF THE INVENTION

1. Field of the Invention

The present invention relates to a semiconductor memory device and a driving method of the same.

2. Related Art

Generally, a semiconductor memory device adopts a redundancy function of replacing a defective memory cell by a memory cell in a redundancy region (spare region) prepared in a memory chip in advance to improve yield. The redundancy function is to replace a defective memory cell by a memory cell in the spare region based on address information read from a fuse during a power-on state. This can provide the memory chip as a non-defective product as a whole.

The information necessary to replace the defective memory cell by the memory cell in the spare region is stored in the fuse. The fuse is conventionally provided separately from a memory cell array. Due to this, the memory chip is disadvantageously made large in size.

Furthermore, when a laser fuse is employed as this fuse, it is necessary to add a step of using a laser to write data. This disadvantageously increases manufacturing costs of the memory chip.

Moreover, when the fuse differs in configuration from each memory cell, it is necessary to evaluate reliability of the fuse separately from that of the memory cell. This also disadvantageously increases the manufacturing costs of the memory chip.

SUMMARY OF THE INVENTION

A semiconductor memory device according to an embodiment of the present invention comprises: a memory cell region comprising a plurality of nonvolatile memory cells; a spare region comprising a spare block for storing therein data instead of a remedy target block, the remedy target block being in the memory cell region and comprising a defective memory cell; a nonvolatile memory fuse region storing therein remedy information necessary for an access to the spare block instead of an access to the remedy target block, the nonvolatile memory fuse region comprising non-defective memory cells other than the defective memory cell in the remedy target block, or comprising memory cells in a first block of the spare region; an initial reading fuse storing therein a block address for identifying the remedy target block or the first block allocated as the nonvolatile memory fuse region, and a selection address for selecting a region in the remedy target block or a region in the first block allocated as the nonvolatile memory fuse region; and a controller configured to acquire the remedy information from the nonvolatile memory fuse region based on the block address and the selection address, and to change the access to the remedy target block to the access to the spare block based on the remedy information.

A method of driving a semiconductor memory device according to an embodiment of the present invention, the semiconductor memory device comprising: a memory cell region comprising a plurality of nonvolatile memory cells; and a spare region comprising a spare block for storing therein data instead of a remedy target block, the remedy target block being in the memory cell region and comprising a defective memory cell, the method comprises:

storing remedy information necessary for an access to the spare block instead of an access to the remedy target block in non-defective memory cells other than the defective memory cell in the remedy target block or in memory cells in a first block of the spare region;

performing a data read operation, the data read operation including:

reading a block address for identifying the remedy target block or the first block and a selection address for identifying a region in the remedy target block or a region in the first block storing therein the remedy information;

reading the remedy information from the non-defective memory cells based on the block address and the selection address; and changing the access to the remedy target block to the access to the spare block based on the remedy information.

DETAILED DESCRIPTION OF THE INVENTION

Embodiments of the present invention will be explained below in detail with reference to the accompanying drawings. Note that the invention is not limited thereto.

Figure 1:
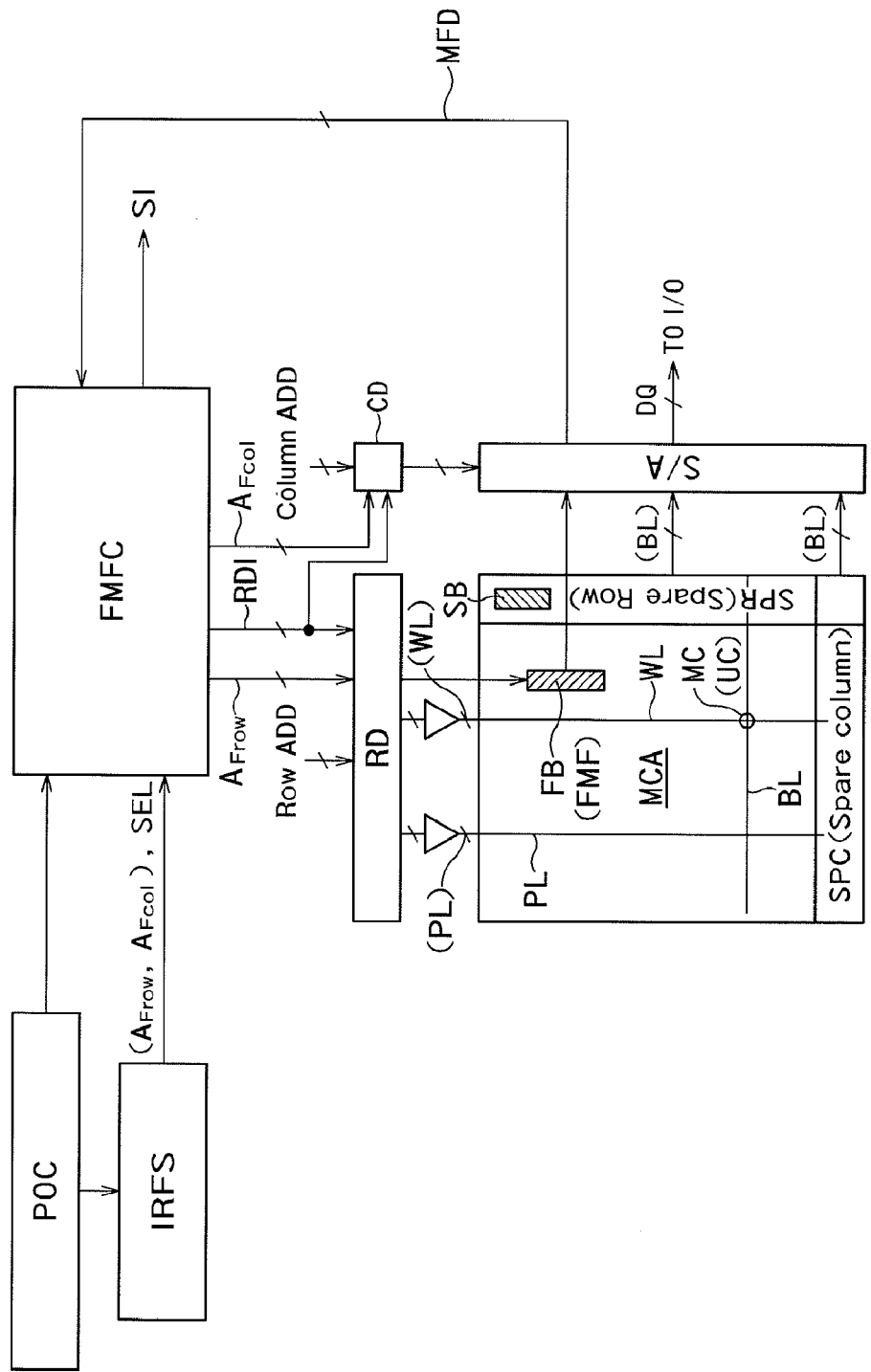
FIG. 1 is a block diagram showing a configuration of a ferroelectric memory device according to one embodiment of the present invention.

FIG. 1 is a block diagram showing a configuration of a ferroelectric memory device according to one embodiment of the present invention. A memory cell array MCA is configured to two-dimensionally arrange a plurality of ferroelectric memory cells MC on a semiconductor substrate. An example of the ferroelectric memory device can be a "series connected TC unit type ferroelectric RAM" in which both ends of a capacitor (C) are connected between a source and a drain of each cell transistor (T), a group of the capacitor (C) and the cell transistor (T) connected in this way is assumed as a "unit cell UC" (also, "memory cell MC")", and in which a plurality of unit cells is connected in series.

Note that the ferroelectric memory device according to this embodiment is not limited to the series connected TC unit type ferroelectric RAM but is applicable to an ordinary ferroelectric memory device. Further, the present embodiment is not applied only to the ferroelectric memory device but applicable also to other nonvolatile memories.

In the series connected TC unit type ferroelectric RAM, one end of a string that connects a plurality of memory cells MC in series is connected to one bit line BL via a selection transistor, and the other end thereof is connected to a plate line PL. A gate of each cell transistor (T) is connected to a word line WL. Bit lines BL and the word lines WL intersect with one another. Memory cells MC are provided to correspond to intersecting points between the bit lines BL and the word line WL, respectively. Plate lines PL extend in the same direction as an extension direction of the word lines WL. The string corresponds to an intersecting point between one bit line BL and one plate line PL. Note that detailed configurations of the memory cell array MCA and the memory cells MC are not shown in the drawings because the present invention is not limited to the series connected TC unit type ferroelectric RAM.

Spare regions SPC and SPR are provided to be adjacent to the memory cell array MCA. The spare regions SPC and SPR are used as a redundancy region and store therein data in place of a defective block FB, which is a remedy target block comprising a predetermined number of or more defective memory cells. A block is a unit for reading or writing data and constituted by a predetermined number of memory cells MC. However, the block is not limited to the unit for reading or writing data but can be set to comprise an arbitrary number of memory cells MC. For example, memory cells corresponding to a predetermined number of rows or columns can be set as a block.

The defective memory cell is a memory cell that fails in a predetermined electrical test and conditions for the electrical test can be arbitrarily set. While the defective block FB comprises the predetermined number of or more defective memory cells, the remaining memory cells are conforming products (non-defective memory cells). Therefore, not all memory cells in the defective block FB are defective but the defective block FB comprises both defective and non-defective memory cells.

Conventionally, the defective block FB is replaced by one of spare blocks in the spare region and then prohibited from being accessed. Accordingly, non-defective memory cells in the defective block FB are not used.

In this embodiment, the defective block FB is replaced by a spare block SB in the spare regions SPC and SPR while non-defective memory cell regions in the defective block FB are allocated as ferroelectric memory fuse regions FMF. The ferroelectric memory fuse regions FMF serving as nonvolatile memory fuse regions have main fuse data MFD stored therein. The main fuse data MFD comprises, for example, remedy information RDI and power supply trimming information necessary to access the spare block SB in place of any one of the defective block FB and other memory chip setting information SI or both thereof. The remedy information RDI comprises, for example, an address of the defective block FB and an address of the spare block SB that stores therein data in place of the defective block FB.

A row decoder RD is configured to receive a row address Row ADD and select one word line WL and one plate line PL according to the row address RowADD.

A column decoder CD is configured to receive a column address ColumnADD and select a read or write target column (bit line BL) according to the column address ColumnADD.

Each sense amplifier S/A is connected to memory cells MC in the memory cell array MCA or the spare regions SPC and SPR via one bit line BL. During a data read operation, the sense amplifier S/A receives data stored in the memory cells MC via the corresponding bit line BL, and temporarily latches the data. The sense amplifier S/A reads data of the selected column to outside of a memory chip via an input/output circuit I/O, a DQ buffer and the like. The ferroelectric memory device according to this embodiment is a destructive readout memory. Accordingly, after detecting the data, the sense amplifier S/A writes back (restores) the data to the memory cells MC. During a data write operation, the sense amplifier S/A connected to a selected column temporarily latches data received from the outside of the memory chip via the input/output circuit I/O, the DQ buffer and the like. The sense amplifier S/A writes the data to the memory cells MC in the selected column via the corresponding bit line BL.

An initial reading fuse system IRFS stores therein a block address ($A_{Frow}$, $A_{Fcol}$) identifying a defective block FB allocated as one ferroelectric memory fuse region FMF and a selection address SEL identifying non-defective memory cells (or memory regions) in this defective block FB. The selection address SEL is an address identifying, for example, the remedy information RDI or the setting information SI. Using the selection address SEL, it is possible to identify a region (row) of the defective block FB serving as the ferroelectric memory fuse region FMF in which the main fuse data MFD is stored.

The initial reading fuse system IRFS can be constituted by a laser fuse or by ferroelectric memory cells similarly to the ferroelectric memory fuse region FMF. The block address ($A_{Frow}$, $A_{Fcol}$) and the selection address SEL are normally data of a small amount of several ten bits, which is far smaller than an amount (a few kilobits) of the main fuse data MFD stored in the ferroelectric memory fuse region FMF. Therefore, even if the initial reading fuse system IRFS is constituted by the laser fuse, the initial reading fuse system IRFS has a smaller influence on a chip area. Further, when the ferroelectric memory cells in the memory cell array MCA are used as the initial reading fuse system IRFS, the chip area can be made smaller than that when the initial reading fuse system IRFS is constituted by the laser fuse.

A ferroelectric memory fuse controller FMFC acquires the main fuse data MFD from the nonvolatile memory fuse FMF based on the block address ($A_{Frow}$, $A_{Fcol}$) and the selection address SEL. The ferroelectric memory fuse controller FMFC is also configured to change an access to the remedy target defective block FB to an access to the spare block SB based on remedy information of this main fuse data MFD.

A power-ON controller POC transmits an initial signal to the ferroelectric memory fuse controller MFMC and the initial reading fuse system IRFS when the memory device is turned on. The ferroelectric memory fuse controller FMFC starts an operation for reading the block address ($A_{Frow}$, $A_{Fcol}$) and the selection address SEL from the initial reading fuse system IRFS using the initial signal from the power-ON controller POC as a trigger.

Figure 2:
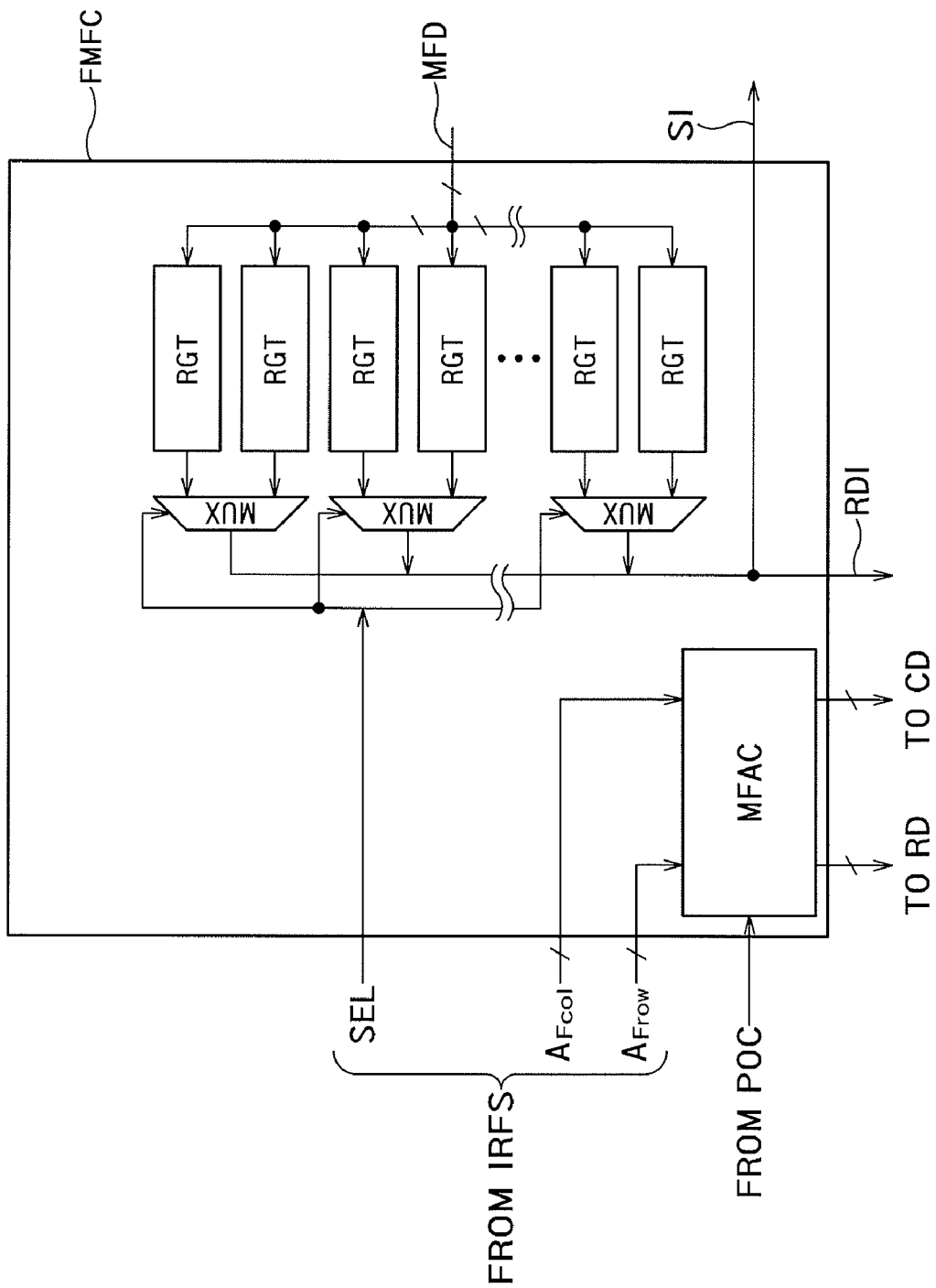
FIG. 2 is a block diagram showing a configuration of the ferroelectric memory fuse controller FMFC.

FIG. 2 is a block diagram showing a configuration of the ferroelectric memory fuse controller FMFC. The ferroelectric memory fuse controller FMFC comprises a memory fuse access controller MFAC, registers RGT, and a multiplexer MUX.

The memory fuse access controller MFAC receives the initial signal from the power-ON controller POC, and transmits the block address ($A_{Frow}$, $A_{Fcol}$) to the row decoder RD and the column decoder CD with the initial signal used as a trigger. It is thereby possible to access a block (the ferroelectric memory fuse region FMF) designated by the block address ($A_{Frow}$, $A_{Fcol}$).

The registers RGT temporarily hold the main fuse data MFD from the ferroelectric memory fuse region FMF. The multiplexer MUX selectively outputs the remedy information RDI out of the main fuse data MFD or the setting information SI based on the selection address SEL from the initial reading fuse system IRFS.

When there is a sufficiently free space in the spare regions SPC and SPR, a block in the spare regions SPC and SPR can be used as the ferroelectric memory fuse region FMF. For example, when the number of defective blocks FB is too small and the main fuse data MFD cannot be stored in the defective blocks FB, there must be a sufficiently free space in the spare regions SPC and SPR because the spare regions SPC and SPR are not used so much for the defective blocks FB. In this case, therefore, it suffices to store the main fuse data MFD in the spare regions SPC and SPR.

Conversely, when the number of defective blocks FB is large, the free space is narrow in the spare regions SPC and SPR because the spare regions SPC and SPR are used for redundancy remedy of the defective blocks FB. However, because the number of non-defective memory cells increases in each defective block FB, the main fuse data MFD can be stored in the defective block FB.

Alternatively, the main fuse data MFD can be stored in both the spare regions SPC and SPR and the defective blocks FB. That is, it suffices that a total capacity of the free space in the spare regions SPC and SPR and that in the defective blocks FB is equal to or larger than the amount of the main fuse data MFD. When there is no sufficient free space both in the spare regions SPC and SPR and the defective blocks FB and thus the main fuse data MFD cannot be stored therein, the memory cell array MCA can be determined to be defective.

When the main fuse data MFD is stored in the spare regions SPC and SPR and the defective blocks FB, a region available as the ferroelectric memory fuse region FMF is made large. In this case, only a region having good electric characteristics as a result of a test out of the spare regions SPC and SPR and the defective blocks FB can be selected as the ferroelectric memory fuse region FMF. This can increase a signal difference in the memory fuse data MFD.

When the main fuse data MFD is stored in the spare regions SPC and SPR, the block address ($A_{Frow}$, $A_{Fcol}$) stored in the initial reading fuse system IRFS indicates a block address in the spare regions SPC and SPR. In addition, the selection address SEL is an address identifying a region in the spare regions SPC and SPR.

[Test Steps]

Figure 3:
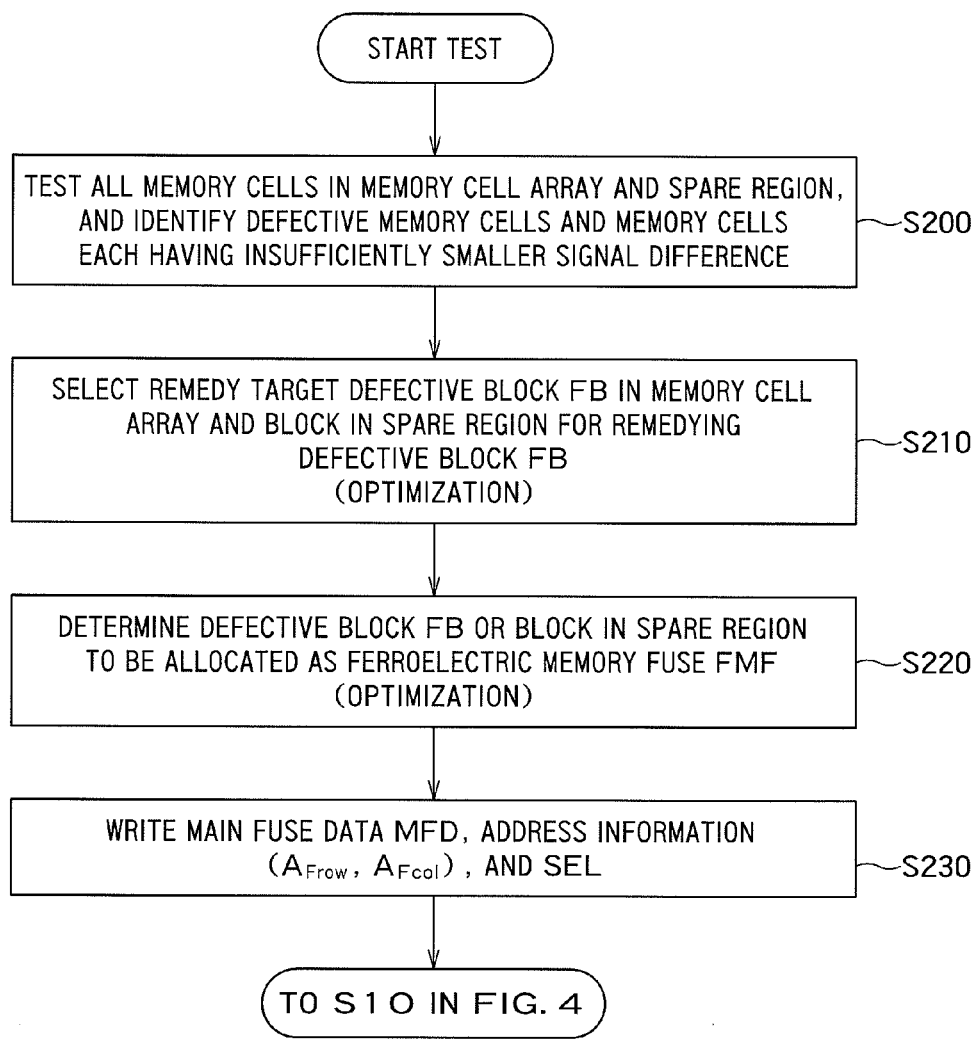
FIG. 3 is a flowchart showing a die sort evaluation in test steps.

FIG. 3 is a flowchart showing a die sort evaluation in test steps. Prior to writing the main fuse data MFD, a test is conducted to the ferroelectric memory device according to this embodiment as a DUT (Device Under Test) using a semiconductor tester (hereinafter, "tester") (not shown).

This test can make clear the block address ($A_{Frow}$, $A_{Fcol}$) of each defective block FB and an address of a non-defective region in the defective block FB. Furthermore, characteristics of non-defective memory cells in the defective blocks FB can be obtained from the test result.

Defective memory cells are sometimes in the spare regions SPC and SPR. Accordingly, in a test mode using the tester, the memory chip is set to be accessible to the spare regions SPC and SPR. The spare regions SPC and SPR are subjected to a similar test using the tester. This can also make clear a block address of a defective block and an address of a non-defective region in the defective block in the spare regions SPC and SPR. Characteristics of non-defective memory cells in the spare regions SPC and SPR can be also obtained. The tester determines a region to which the memory fuse data MFD is to be written based on the characteristics of the memory cells.

First, in the test steps, all the memory cells in the memory cell array MCA and the spare regions SPC and SPR are tested using the tester, thereby identifying defective memory cells and memory cells each having an insufficiently smaller signal difference (S200). The signal difference means a signal difference (voltage difference) between data "0" and data "1".

A remedy target block (defective block) in the memory cell array MCA and a block in the spare regions SPC and SPR for remedying the defective block are selected (S210). At this time, the defective block and the block in the spare regions SPC and SPR are selected so that the signal difference is as great as possible. This is referred to as "optimization".

Next, a defective block or a block in the spare regions SPC and SPR to be allocated as the ferroelectric memory fuse region FMF is determined (S220). At this time, the tester allocates the defective block or the block in the spare regions SPC and SPR of a capacity required to store the main fuse data MFD as the ferroelectric memory fuse region FMF based on the test result. Furthermore, the tester allocates the defective block or the block in the spare regions SPC and SPR as the ferroelectric memory fuse region FMF so that the signal difference in the ferroelectric memory fuse region FMF is as great as possible. That is, even for selection of the ferroelectric memory fuse region FMF, optimization is carried out. For example, a block having the greatest signal difference among a plurality of defective blocks is allocated as the ferroelectric memory fuse region FMF.

Thereafter, the main fuse data MFD is written to the ferroelectric memory fuse region FMF, and the address information ($A_{Frow}$, $A_{Fcol}$) and SEL is written to the initial reading fuse system IRFS (S230). A data write operation will be described later in detail with reference to FIG. 4.

In this way, not only the memory cell array MCA and the spare regions SPC and SPR but also any one of the ferroelectric memory fuse region FMF and the initial reading fuse system IRFS or both thereof are optimized. It is thereby possible to increase a margin of a signal amount in any one of the ferroelectric memory fuse region FMF and the initial reading fuse system IRFS or both thereof.

[Writing of Main Fuse Data MFD]

Figure 4:
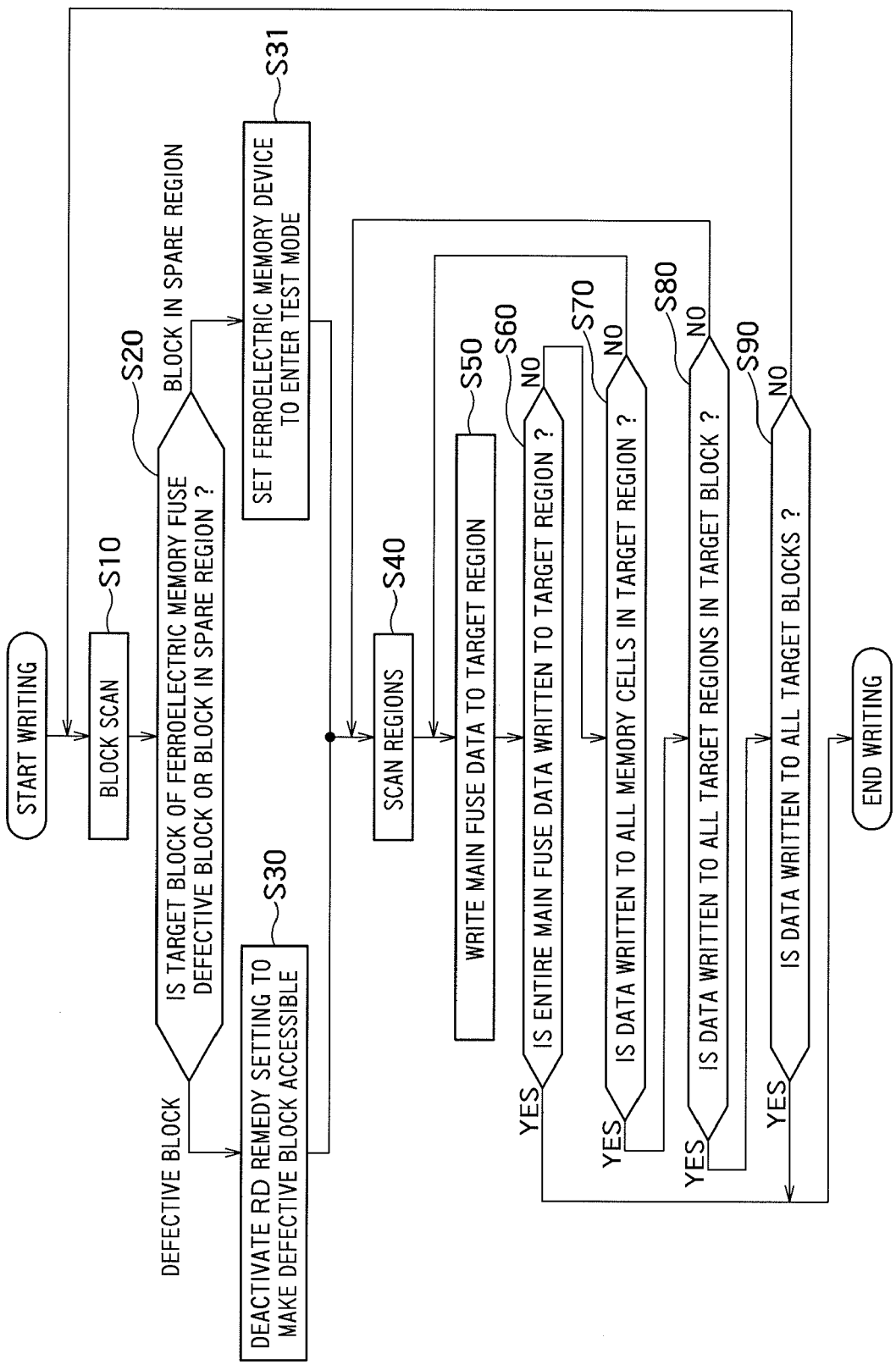
FIG. 4 is a flowchart showing an operation for writing the main fuse data MFD to the ferroelectric memory fuse region FMF.

FIG. 4 is a flowchart showing an operation for writing the main fuse data MFD to the ferroelectric memory fuse region FMF. A block to which the main fuse data MFD is to be written is referred to as "target block" and a region in the target block to which the main fuse data MFD is to be written is referred to as "target region".

The data write operation for writing the main fuse data MFD is then performed. First, the tester executes a block scan and identifies the target block based on the address of the target block (S10).

The tester changes modes of the memory device between an instance in which the target block is in the memory cell array MCA and an instance in which the target block is present in the spare regions SPC and SPR (S20). Whether the target block is in the memory cell array MCA or in the spare regions SPC and SPR is known in advance by the block address.

When the target block is the defective block FB in the memory cell array MCA, redundancy remedy setting used in the normal operation is deactivated to make the defective block FB accessible (S30). In the normal operation, the redundancy remedy setting functions effectively. Accordingly, even if a logical address is designated to access the defective block FB, a block in the spare regions SPC and SPR is accessed in place of the defective block FB. By contrast, at step S30, this redundancy remedy setting is deactivated, thereby making it possible to access the defective block FB when the logical address is designated.

When the target block is a block in the spare regions SPC and SPR, the ferroelectric memory device is set to enter the test mode (S31). In the normal operation, an access to the spare regions SPC and SPR is made for remedy of the defective block FB. Accordingly, the spare regions SPC and SPR cannot be accessed on purpose. By contrast, at step S31, the ferroelectric memory device enters the test mode, thereby making the spare regions SPC and SPR accessible. For example, in a die sort test using the tester, the spare regions SPC and SPR can be directly accessed. Therefore, to access the spare regions SPC and SPR, the ferroelectric memory device is set into the same state as this test mode so that the data can be directly written to the spare regions SPC and SPR.

Next, the tester scans regions in the defective block FB and identifies the target region based on the address of the target region (S40). Thereafter, the main fuse data MFD is written to the target region (S50). Because the operation for writing the main fuse data MFD is the same as a data write operation in the normal operation except that specific data differ, the data write operation is not described herein in detail. The data write operation is continuously executed until the entire main fuse data MFD is written to the target region (S60).

The processes at steps S50 and S60 are repeated until the main fuse data MFD is written to all the memory cells in the target region (S70, NO). When the main fuse data MFD is written to all the memory cells in the target region (S70, YES), the main fuse data MFD is written to another target region in the target block. That is, when there is a free space in the target block (S80, NO), the region scan (S40) is executed and a next target region is designated. The main fuse data MFD is further written to the designated target region (S50).

When the main fuse data MFD is written to all the target regions in the target block (S80, YES), the main fuse data MFD is written to another target block. That is, when there is still a defective block FB or a block in the spare regions SPC and SPR to which the main fuse data MFD is to be written (S90, NO), the block scan (S10) is executed and a next target block is designated. Further, the processes at steps S30 (or S31) to S90 are executed.

When the main fuse data MFD is written to all the target blocks (S90, YES), the data write operation ends. That is, the data write operation ends not only when the main fuse data MFD is completely written but also when there are insufficient target blocks. When the main fuse data MFD is completely written, the data write operation can be said to normally end. When there are insufficient target blocks, the memory chip is determined to be defective. It is the tester that can electrically execute the data write operation at all the test steps.

[Writing of Address Information ($A_{Frow}$, $A_{Fcol}$) and SEL]

When the initial reading fuse system IRFS is constituted by the laser fuse, it is necessary to apply laser for writing the data. Accordingly, the address information ($A_{Frow}$, $A_{Fcol}$) and SEL is written at a laser writing step different from the test steps.

Meanwhile, when the initial reading fuse system IRFS is constituted by the ferroelectric memory fuse, the tester can write the address information ($A_{Frow}$, $A_{Fcol}$) and SEL to the initial reading fuse system IRFS at the test steps. This writing to the initial reading fuse system IRFS can be executed before start of the operation for writing the main fuse data MFD shown in FIG. 4, after end thereof, or simultaneously therewith.

Because each of the ferroelectric memory fuse and the laser fuse is a nonvolatile memory, every ferroelectric memory device is shipped in a state in which the address information ($A_{Frow}$, $A_{Fcol}$) and SEL and the main fuse data MFD are stored.

[Reading of Address Information ($A_{Frow}$, $A_{Fcol}$) and SEL and Main Fuse Data MFD]

Figure 5:
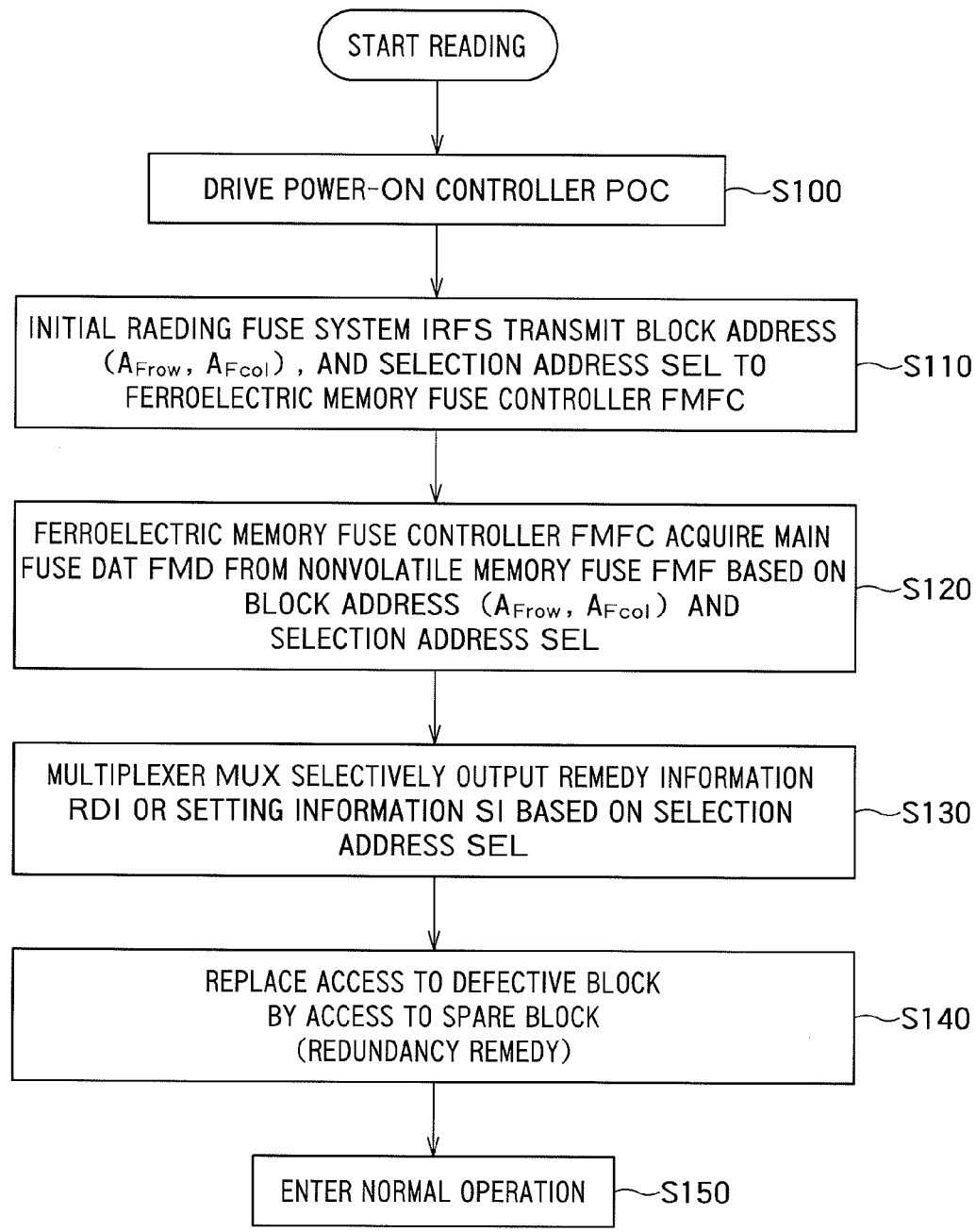
FIG. 5 is a flowchart showing an operation for reading the ($A_{Frow}$, $A_{Fcol}$) and SEL and the main fuse data MFD.

FIG. 5 is a flowchart showing an operation for reading the ($A_{Frow}$, $A_{Fcol}$) and SEL and the main fuse data MFD.

When power is fed to the ferroelectric memory device before the device starts the normal operation, the power-ON controller POC is driven (S100). As a result, as stated above, the power-ON controller POC transmits the initial signal to the initial reading fuse system IRFS and the ferroelectric memory fuse controller FMFC. The initial reading fuse system IRFS and the ferroelectric memory fuse controller FMFC start operating with the initial signal used as a trigger.

The initial reading fuse system IRFS transmits the block address ($A_{Frow}$, $A_{Fcol}$) and the selection address SEL to the ferroelectric memory fuse controller FMFC (S110).

The ferroelectric memory fuse controller FMFC acquires the main fuse data MFD from the nonvolatile memory fuse FMF based on the block address ($A_{Frow}$, $A_{Fcol}$) and the selection address SEL (S120). At this stage, the memory device is not set to execute the redundancy function yet. Accordingly, differently from the normal operation, any one of the defective blocks FB and the blocks in the spare regions SPC and SPR or both thereof to be used as the ferroelectric memory fuse region FMF are accessible.

The multiplexer MUX selectively outputs the remedy information RDI out of the main fuse data MFD or the setting information SI based on the selection address SEL (S130). The multiplexer MUX can output either the remedy information RDI or the setting information SI prior to the other. Based on the remedy information RDI, a logical address to be allocated as the address of the defective block FB is allocated to the spare block SB. Therefore, during the data write operation in the normal operation, the spare block SB stores therein the data in place of the defective block FB. Further, during the data read operation in the normal operation, the data is read from the spare block SB in place of the defective block FB. That is, an access to the defective block FB is replaced by an access to the spare block SB, thus fulfilling the redundancy remedy function (S140).

Thereafter, the ferroelectric memory device enters the normal operation (S150). In the normal operation, the memory device automatically executes the redundancy remedy function. Accordingly, a user can use the memory device without consciousness of the defective block FB and the spare block SB. After setting the redundancy remedy function, the ferroelectric memory fuse region FMF falls out of an access target, which prevents the ferroelectric memory fuse region FMF from being accessed during the normal operation.

The ferroelectric memory device according to this embodiment stores the main fuse data MFD comprising the remedy information RDI and the setting information SI in any one of the defective block FB and the block in the spare regions SPC and SPR or both thereof. This can dispense with providing a dedicated fuse for the main fuse data MFD and thereby suppress an increase in the area of the memory chip.

Furthermore, the memory fuse data MFD is stored in any one of the defective block FB in the memory array MCA used in the normal operation and the block in the spare regions SPC and SPR or both thereof. Therefore, it is possible to read the main fuse data MFD using an existing control circuit and there is no need to add a dedicated control circuit to access the dedicated fuse.

Moreover, any one of the defective block FB in the memory array MCA used in the normal operation and the block in the spare regions SPC and SPR or both thereof are used as the ferroelectric memory fuse region FMB. It is, therefore, possible to perform the die sort evaluation of the ferroelectric memory fuse region FMF at normal test steps. That is, there is no need to execute a special evaluation step for the die sort evaluation of the ferroelectric memory fuse region FMF. This can prevent an increase in test costs. It is possible to keep reliability of the ferroelectric memory fuse region FMF similarly high to that of the other memory cells in the memory cell array MCA.

When the ferroelectric memory cells in the memory cell array MCA or the spare regions SPC and SPR are used as the initial reading fuse system IRFS, similar effects to those for the ferroelectric memory fuse region FMF can be attained for the initial reading fuse system IRFS. That is, because there is no need to provide the dedicated fuse to the initial reading fuse system IRFS, it is possible to suppress the increase in the area of the memory chip. As for the main fuse data MFD on the initial reading fuse system IRFS, the address information ($A_{Frow}$, $A_{Fcol}$) and SE can be read using the existing control circuit, so that there is no need to add the dedicated control circuit to access the dedicated fuse. Further, the die sort evaluation of the initial reading fuse system IRFS can be performed at the normal test steps. That is, no special evaluation step is necessary for the die sort evaluation of the initial reading fuse system IRFS. Accordingly, the test costs do not increase. The reliability of the initial reading fuse system IRFS can be kept similarly high to that of the other memory cells in the memory cell array MCA.

It is necessary to secure some ferroelectric memory cells specified at a memory design stage in advance as the initial reading fuse system IRFS. Due to this, it is necessary to slightly increase the capacity of the memory cell array MCA or that of the spare regions SPC and SPR. Nevertheless, a data amount of the address information stored in the initial reading fuse system IRFS is considerably smaller than that of the main fuse data MFD as already stated. Accordingly, even if the ferroelectric memory cells are arranged in the memory cell array MCA or the spare regions SPC and SPR as the initial reading fuse system IRFS, an increase in an area of the memory cell array MCA or the spare regions SPC and SPR is negligibly small.

The invention claimed is:

1. A semiconductor memory device comprising:
a memory cell region comprising a plurality of nonvolatile memory cells;
a spare region comprising a spare block configured to store data instead of a remedy target block in the memory cell region and comprising a defective memory cell;
a nonvolatile memory fuse region configured to store remedy information for an access to the spare block, the nonvolatile memory fuse region comprising non-defective memory cells other than the defective memory cell in the remedy target block, or comprising memory cells in a first block of the spare region;
an initial reading fuse configured to store a block address for identifying the remedy target block or the first block allocated as the nonvolatile memory fuse region, and a selection address configured to select a region in the remedy target block or a region in the first block allocated as the nonvolatile memory fuse region; and
a controller configured to receive the remedy information from the nonvolatile memory fuse region based on the block address and the selection address, and to change the access to the remedy target block to the access to the spare block based on the remedy information.

2. The device of claim 1, wherein the initial reading fuse comprises a laser fuse.

3. The device of claim 1, wherein the initial reading fuse comprises a nonvolatile memory cell.

4. The device of claim 1, wherein the nonvolatile memory cell is a ferroelectric memory cell.

5. The device of claim 2, wherein the nonvolatile memory cell is a ferroelectric memory cell.

6. The device of claim 3, wherein the nonvolatile memory cell is a ferroelectric memory cell.

7. A method of driving a semiconductor memory device, the semiconductor memory device comprising: a memory cell region comprising a plurality of nonvolatile memory cells; and a spare region comprising a spare block configured to store data instead of a remedy target block in the memory cell region and comprising a defective memory cell, the method comprising:
storing remedy information for an access to the spare block instead of an access to the remedy target block in non-defective memory cells other than the defective memory cell in the remedy target block or in memory cells in a first block of the spare region;
reading data comprising:
reading a block address for identifying the remedy target block or the first block and a selection address for identifying a region in the remedy target block or a region in the first block configured to store the remedy information;
reading the remedy information from the non-defective memory cells based on the block address and the selection address; and
changing the access to the remedy target block to the access to the spare block based on the remedy information.

8. The method of claim 7, comprising writing the remedy information to the non-defective memory cells other than the defective memory cell in the remedy target block or to the memory cells in the first block of the spare region while testing the memory cell array.

9. The method of claim 8, comprising:
deactivating remedy setting of changing the access to the remedy target block to the access to the spare block in order to allow an access to the remedy target block while writing the remedy information to the non-defective memory cells other than the defective memory cell in the remedy target block; and
setting the semiconductor memory device to a test mode allowing an access to the spare region while writing the remedy information to the memory cells in the first block.

10. The method of claim 7, wherein the remedy information is stored in a block comprising a substantially large signal difference among the memory cells, out of the remedy target blocks.

11. The method of claim 8, wherein the remedy information is stored in a block comprising a substantially large signal difference among the memory cells, out of the remedy target blocks.

12. The method of claim 9, wherein the remedy information is stored in a block comprising a substantially large signal difference among the memory cells, out of the remedy target blocks.

* * * * *